United States Patent [19]

Väisänen

[11] Patent Number: 5,057,847
[45] Date of Patent: Oct. 15, 1991

[54] RF CONNECTOR FOR CONNECTING A MOBILE RADIOTELEPHONE TO A RACK

[75] Inventor: Risto Väisänen, Salo, Finland

[73] Assignee: Nokia Mobile Phones Ltd., Salo, Finland

[21] Appl. No.: 526,825

[22] Filed: May 22, 1990

[30] Foreign Application Priority Data

May 22, 1989 [FI] Finland ................... 892480

[51] Int. Cl.$^5$ ................... H01Q 1/24; H01P 5/00
[52] U.S. Cl. ................... 343/702; 333/24 C; 333/260; 333/26; 379/58; 343/859
[58] Field of Search ................... 333/24 C, 26, 260; 343/702, 711, 713, 859, 860, 906; 379/58, 59; 455/89, 90

[56] References Cited

U.S. PATENT DOCUMENTS 4,764,773 8/1988 Larsen et al. ................... 343/713

*Primary Examiner*—Paul Gensler
*Attorney, Agent, or Firm*—Darby & Darby

[57] ABSTRACT

An RF connector for connecting a radiotelephone (1) to an external antenna, whereby the telephone and a corresponding device rack (2) are connected to the external antenna by two pairs of matching metal plates (1*a*, 2*a*, 1*b*, 2*b*) that provide a capacitive two-wire connector-interface. In order to avoid too large a size and too high an attenuation, a coil (3*a*, 3*b*) is connected in series with the pair of plates (1*a*, 2*a*; 1*b*, 2*b*) constituting each capacitor. The coil and capacitor are dimensioned so that they form a resonant circuit with an attenuation of nearly 0 at the desired transmission frequency. A first balancing transformer (4) before the resonant circuit transforms the signal into a balanced signal, and a second balancing transformer (5) after the resonant circuit transforms the signal back to an unbalanced signal to be transmitted further on a coaxial cable.

5 Claims, 1 Drawing Sheet

RF CONNECTOR FOR CONNECTING A MOBILE RADIOTELEPHONE TO A RACK

FIELD OF THE INVENTION

The present invention relates to an RF connector for the connection of a mobile device, and, more particularly, to an RF connector between a radiotelephone and an external antenna, whereby the mobile device and corresponding device rack, which is connected to the external antenna, have two pairs of matching metal plates that provide a capacitive two-wire connector-interface.

BACKGROUND OF THE INVENTION

Two antenna connectors are generally employed in mobile radiotelephones. One is connected to the antenna for use when the telephone operates as a portable device and the other is used when the radiotelephone is mounted in a car. The car antenna is switched into operation through the auxiliary antenna connector with the aid of an antenna change-over switch of the radiotelephone.

At present the most broadly employed connector types rely on a galvanic contact, whereby they exhibit the following disadvantages:

the connecter surfaces become worn and corroded over time;

the connectors are easily damaged by mechanical stresses;

the connectors are visible, and they can only be concealed in the telephone body using a separate protecting lid or the like.

Depending on the connector type there may exist further disadvantages:

the connector must be exactly aligned when mounted into the rack in a car (e.g. a common coaxial connector);

the connector occupies a large space inside the telephone (this is the case with most present connectors);

the connector easily becomes dirty (e.g. a coaxial connector);

the connector is expensive (e.g. specially made surface mount connectors).

Recently it was realized that it is advantageous to employ a capacitive RF connector which comprises two pairs of metal plates. A pair of smaller metal plates constitutes the inner conductor of the RF interface for the coaxial cable and a pair of larger plates constitutes the outer conductor of the interface. This outer conductor is formed by the metallic body of the telephone and has a size, e.g., of 6×18 cm, and constitutes the sheath of the coaxial cable.

Because the earth (ground) conductor is disconnected with a capacitor, the capacitance must be high in order to achieve a low attenuation. In a known implementation, this was solved by utilizing the metallic body of the telephone. On the other hand, the capacitances of the inner conductor capacitors must also be relatively high, because the signal transmission is carried out at a relatively low impedance level (about 50 ohms).

SUMMARY OF THE INVENTION

The object of the present invention is to provide a connector based on capacitance plates, with which said disadvantages of known solutions will be obviated. In order to achieve this, the invention comprises a coil connected in series with a pair of plates constituting each capacitor so that the coil and the capacitor form a resonant circuit at the employed transmission frequency. A balancing transformer is introduced into the signal transmission path, which transforms the signal into a balanced signal before the signal is received by the resonant circuit. A second balancing transformer transforms the signal back to an unbalanced signal after the signal passes the resonant circuit.

Preferably the pairs of plates comprise four metal plates of the same size, and the plates on the portable device side are located under the plastic casing of the device.

The impedance values of the balancing transformers could be, e.g. 50 ohm/200 ohm on the input side and, e.g., 200 ohm/50 ohm on the output side of the resonant circuit.

The connector according to the present invention is not easily damaged by mechanical stresses. Because the plates can be located under the plastic casing, it is possible to conceal it and keep out dirt. The connector is inexpensive and occupies only a small space. It will not present alignment problems because the plates need not match exactly in the lateral direction and in depth; in practice a precision of about 20% is sufficient.

The connector presents no wear problems or contacting problems because there is no galvanic connection between the plates.

The attenuation of the connector is low, and it operates as a filter, attenuating harmonics of the transmitter and rejecting spurious responses of the receiver.

In a digital radiotelephone (e.g. in a European GSM convention telephone) all of the connectors may be made without any galvanic contact surfaces (except for the charging interface in the battery package) when the logic signals are interfaced with an optical interface and the auxiliary RF antenna connector is connected with a capacitive connector.

BRIEF DESCRIPTION OF THE DRAWINGS

The invention will be described further by way of an example referring to the accompanying drawing, where

Referring to FIG. 1, the connector comprises four metal plates 1a, 1b, 2a, 2b of the same size, two coils 3a and 3b, and two balancing elements 4 and 5, as will be described below.

Figure 1:
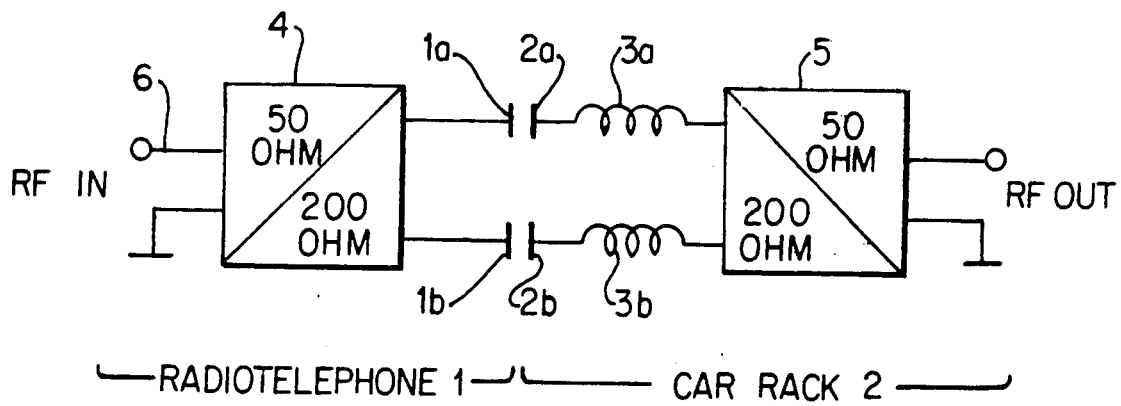
FIG. 1 shows the basic circuit arrangement of the RF connector according to the present invention.

The signal (RFin) of the input coaxial cable (6) is first transformed into a balanced signal through a balancing transformer (4) having, for example an input impedance of 50 ohms and an output impedance of 200 ohms. After the balancing transformer (4) the signal is connected to two metal plates (1a, 1b) located on the outer casing of the telephone (1), preferably protected under the surface of the casing.

On the car rack side (2) there are similar metal plates (2a, 2b) located on points corresponding to the plates (1a, 1b) on the radiotelephone (1) when the telephone is mounted in the rack. Thereby the four plates (1a, 1b, 2a, 2b) constitute two capacitors, permitting the passage of an RF signal. The signal transmission would not be possible using only capacitors, however, because the high impedance of the capacitors causes very high attenuation. In order to obviate this problem a coil (3a, 3b), is placed along each signal path in series with each capacitor, the reactance value of the coil being equal to the reactance value of the respective capacitor formed by the pair of plates. Thus, the plates and coils form series-resonant circuits with an impedance of nearly 0 ohm at the desired transmission frequency. After passing the resonant circuit, the signal is transformed by a second balancing transformer (5) back to an unbalanced signal (RFout), which then can be transmitted to a car antenna through an output coaxial cable (7).

Figure 2:
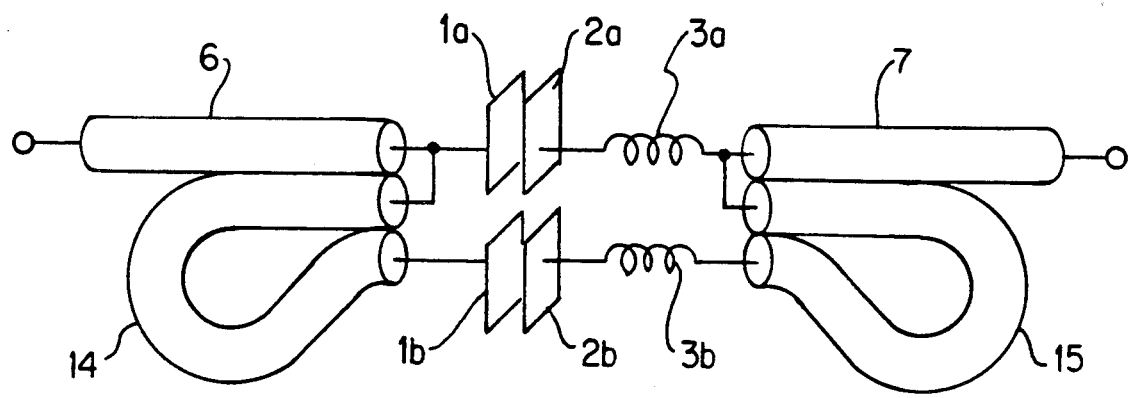
FIG. 2 shows a practical implementation of the connector circuit.

FIG. 2 shows an embodiment of the connector according to the invention. The construction is very simple, short pieces of coaxial cable measuring a half wave in length are used as balancing transformers (4,5). The length of the cable piece is e.g. about 11.5 cm when the operating frequency is 900 MHz.

It will be appreciated that other designs may be applied within the limits of the invention idea.

What is claimed is:

1. An RF connector for connecting a mobile device to a corresponding device rack for releasably receiving the mobile device, comprising:
   an external antenna connected to the rack;
   a first pair of metal plates on the mobile device;
   the corresponding device rack having a second pair or metal plates;
   said first and second pairs of metal plates forming a capacitative two-wire connector-interface when the mobile device is received in the rack, each connector-interface including a capacitor formed from one of said first pair of metal plates and one of said second pair of metal plates;
   said capacitor having a coil in serial connection therewith, each said coil and capacitor connection forming a resonant circuit at a desired transmission frequency;
   a first balancing transformer in said mobile device for transforming an unbalanced signal received from an input cable into a balanced signal and for sending said balanced signal to an input of said resonant circuit; and
   a second balancing transformer in said rack for receiving said balanced signal from an output of said resonant circuit and transforming said balanced signal into an unbalanced signal and for sending said unbalanced signal to an output cable.

2. The RF connector of claim 1, characterized in that the first and second pairs of plates comprise four metal plates of the same size.

3. The RF connector of claim 1 or 2, characterized in that the impedance values of the first and second balancing transformers are 50 ohm/200 ohm for said first balancing transformer at said input and 200 ohm/50 ohm for said second balancing transformer at said output of the resonant circuit.

4. The RF connector of claim 1, characterized in that the first pair of metal plates are located under a plastic casing of the device.

5. The RF connector of claim 1, characterized in that the first and second balancing transformers each comprise a short piece of coaxial cable measuring a half wave in length.

* * * * *